(12) United States Patent
Derat

(10) Patent No.: US 11,486,922 B1
(45) Date of Patent: Nov. 1, 2022

(54) OVER-THE-AIR MEASUREMENT SYSTEM AND OVER-THE-AIR MEASUREMENT METHOD

(71) Applicant: Rohde & Schwarz GmbH & Co. KG, Munich (DE)

(72) Inventor: Benoit Derat, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/472,280

(22) Filed: Sep. 10, 2021

(51) Int. Cl.
*G01R 31/28* (2006.01)

(52) U.S. Cl.
CPC ..... *G01R 31/2879* (2013.01); *G01R 31/2891* (2013.01); *G01R 31/2865* (2013.01)

(58) Field of Classification Search
CPC ........................ G01R 31/2879; G01R 31/31924
See application file for complete search history.

(56) References Cited

U.S. PATENT DOCUMENTS

| | | | |
|---|---|---|---|
| 10,396,909 B1 | 8/2019 | Cardalda-Garcia et al. | |
| 2008/0056340 A1* | 3/2008 | Foegelle | H04B 17/0082 375/224 |
| 2015/0054687 A1* | 2/2015 | Reed | H04B 17/101 342/361 |

FOREIGN PATENT DOCUMENTS

CN 110470914 A 11/2019

* cited by examiner

*Primary Examiner* — Tung X Nguyen
(74) *Attorney, Agent, or Firm* — Christensen O'Connor Johnson Kindness PLLC

(57) ABSTRACT

An over-the-air (OTA) measurement system is described. The OTA measurement system includes a plurality of measurement antennas, a DUT positioner, and a controller (e.g., control circuit). The DUT positioner is configured to position a device under test at a test location. At least two measurement antennas of the plurality of measurement antennas are arranged at different distances from the test location. The at least two measurement antennas are arranged at different elevation angles and/or at different azimuth angles with respect to the test location. The controller is configured to control the DUT positioner to rotate the device under test at the test location in azimuth and/or elevation. The controller is configured to control the DUT positioner to rotate the device under test into a first orientation for a first OTA power measurement by a first one of the at least two measurement antennas. The controller is configured to control the DUT positioner to rotate the device under test into a second orientation for a second OTA power measurement by a second one of the at least two measurement antennas. A relative orientation between the device under test in the first orientation and the first one of the at least two measurement antennas is the same as a relative orientation between the device under test in the second orientation and the second one of the at least two measurement antennas. Further, an OTA measurement method for performing OTA measurements on a device under test by an OTA measurement system is described.

20 Claims, 4 Drawing Sheets

OVER-THE-AIR MEASUREMENT SYSTEM AND OVER-THE-AIR MEASUREMENT METHOD

FIELD OF THE DISCLOSURE

Embodiments of the present disclosure generally relate to an over-the-air (OTA) measurement system. Embodiments of the present disclosure further relate to an OTA measurement method for performing OTA measurements on a device under test by an OTA measurement system.

BACKGROUND

In OTA tests of devices having at least one antenna, measurements of parameters are often required to be made in the far-field. Different techniques allow to perform far-field measurements, for example direct far-field (DFF) techniques, or indirect far-field (IFF) techniques.

DFF techniques usually involve probing the antenna field beyond the Fraunhofer distance, while IFF techniques usually employ a compact antenna test range (CATR) or plane-wave synthesis techniques.

IFF techniques have the advantage over the DFF approach that they enable accurate measurements of a given radiation aperture in much more compact space.

Despite the decreased overall size of the test system, IFF setups do not necessarily show much better dynamic range than DFF setups. At high frequencies such as millimeter-waves, the limited dynamic range may become an issue. For 3GPP 5G NF FR2 UE conformance testing, some test cases involve, for example, low uplink or high downlink powers, such that a high dynamic range is required.

Accordingly, there is a need for an OTA measurement system and an OTA measurement method that allow for performing OTA measurements in a compact space and with an improved dynamic range.

SUMMARY

Embodiments of the present disclosure provide an over-the-air (OTA) measurement system. In an embodiment, the OTA measurement system comprises a plurality of measurement antennas, a DUT positioner, and a control circuit, such as a controller. The DUT positioner, including for example one or more linear or rotational stages, is configured to position a device under test at a test location. At least two measurement antennas of the plurality of measurement antennas are arranged at different distances from the test location. The at least two measurement antennas are arranged at different elevation angles and/or at different azimuth angles with respect to the test location.

The controller is configured to control the DUT positioner to rotate the device under test at the test location in azimuth and/or elevation. The controller is configured to control the DUT positioner to rotate the device under test into a first orientation for a first OTA power measurement by a first one of the at least two measurement antennas. The controller is configured to control the DUT positioner to rotate the device under test into a second orientation for a second OTA power measurement by a second one of the at least two measurement antennas. A relative orientation between the device under test in the first orientation and the first one of the at least two measurement antennas is the same as a relative orientation between the device under test in the second orientation and the second one of the at least two measurement antennas.

Therein and in the following, the term OTA power measurements is understood to denote uplink power measurements and/or downlink power measurements.

In the case of uplink power measurements, a signal transmitted by the device under test is received by the respective measurement antenna. The power of the signal received from the device under test is then measured by the OTA measurement system, for example by a corresponding power measurement circuit.

In the case of downlink power measurements, a signal having a predetermined power is generated by the respective measurement antenna and received by the device under test. Accordingly, the device under test may measure the power of the signal received from the respective measurement antenna.

The OTA measurement system according to the present disclosure is based on the idea to provide several measurement antennas in different distances with respect to the test location where the device under test is placed for the OTA power measurements.

The OTA power measurements may be conducted by a single one of the measurement antennas at a time. After the OTA power measurement by the respective measurement antenna is done, the device under test is rotated such that the same portion of the transmitting lobe and/or receiving lobe of the device under test can be measured by the next measurement antenna, but at a different distance, as the relative orientation between the device under test and the respective measurement antenna is the same for all OTA power measurements.

Therein and in the following, the term "the same portion of the transmitting lobe and/or receiving lobe of the device under test can be measured" is understood to denote that the same solid angle of the respective transmitting lobe and/or receiving lobe can be measured, i.e. that the same solid angle of the respective transmitting lobe and/or receiving lobe of the device under test faces the respective measurement antenna for all OTA power measurements.

In the context of the present disclosure, it is to be understood that two relative orientations are the same even if there are small deviations, for example due to positioning errors.

In some embodiments, two relative orientations are understood to be the same if the relative azimuth angles and/or the relative elevation angles are approximately the same. For example, the relative azimuth angles and/or the relative elevation angles may differ by a few percent.

Accordingly, there may also be small deviations of the portion of the transmitting lobe and/or receiving lobe of the device under test that is measured in the individual OTA power measurements.

The measurement antennas may be stationary, i.e., there is no need for repositioning means in order to adapt measurement positions, for example the distances to the test location, of the measurement antennas within the OTA measurement system. Instead, the device under test can simply be rotated in order to perform OTA power measurement at different distances. This is generally advantageous, as such repositioning means may introduce further unwanted reflections into the OTA measurement system and may require additional space.

Moreover, mounting structures of the stationary measurement probes can be covered with absorber materials or absorber structures that are configured to absorb electromagnetic waves in a convenient manner, thereby reducing unwanted reflections in the OTA measurement system.

Additionally, as there is no need for repositioning the measurement probes between measurements, the overall time needed for performing the OTA measurements is reduced.

With the OTA measurement system according to the present disclosure, OTA measurements at small distances from the device under test are possible. Thus, a particularly compact OTA measurement system is provided.

Moreover, it has turned out that an improved dynamic range is obtained by the OTA measurement system according to the present disclosure, as the OTA power measurements can be performed in a compact space, i.e., at small distances from the device under test.

Accordingly, the OTA measurement system according to the present disclosure can be used for OTA measurements even for devices under test having a high operating frequency, for example in the millimeter-wave range. For example, the OTA measurement system according to the present disclosure may be used for 5G conformance testing.

According to an aspect of the present disclosure, the plurality of measurement antennas is arranged in a measurement region, wherein the measurement region is associated with a near-field of the device under test. If the plurality of measurement antennas is arranged in the near-field region of the device under test, for example high dynamic ranges are obtainable due to the small distances between the measurement antennas and the device under test. Thus, this measurement setup is particularly useful if high dynamic ranges are necessary, for example for high frequency measurements involving both high uplink (and/or downlink) power and low uplink (and/or downlink) power.

As will be described in more detail below, intermediate-field properties and/or far-field properties of the device under test can be derived from the OTA power measurements within the near-field region of the device under test. Accordingly, the complete relevant transmitting range and/or receiving range of the device under test can be tested by performing the OTA power measurements in the near-field region of the device under test, with all the advantages described above.

In some embodiments, the intermediate-field properties and/or far-field properties of the device under test can be derived based on the OTA power measurements alone, such that no phase measurements are necessary, which are typically difficult to execute in the near-field region of the device under test.

According to another aspect of the present disclosure, the plurality of measurement antennas comprises N measurement antennas, wherein N is an integer greater than two. In some embodiments, N is equal to 3, 4, 5, 6, etc. Thus, a number of N OTA power measurement may be performed, for example at N different distances, such that a plurality of measurement points with respect to the OTA power measurements is available for assessing the performance of the device under test.

In an embodiment of the present disclosure, the distances of the N measurement antennas from the test location and/or the elevation angles and/or the azimuth angles of the N measurement antennas with respect to the test location are pairwise different. Accordingly, N OTA power measurements may be performed at N different distances.

Therein, a single OTA power measurement may be performed by a single measurement antenna at the time. Between the individual OTA power measurements, the device under test may be rotated to face the next measurement antenna. As already explained above, the same portion of the transmitting lobe and/or the receiving lobe of the device under test is probed in each OTA power measurement by ensuring that the device under test has the same relative orientation to the respective measurement antenna for each OTA power measurement.

In a further embodiment of the present disclosure, the controller is configured to control the DUT positioner to rotate the device under test into N different orientations, wherein each orientation is associated with an OTA power measurement. In other words, a number of N different OTA power measurements may be performed by successively rotating the device under test into the N different orientations.

According to a further aspect of the present disclosure, a relative orientation between the device under test and the respective measurement antenna used for the respective OTA power measurement is the same for the N different orientations. In other words, the device under test has the same relative orientation to the respective active measurement antenna being active during the respective OTA power measurement for each OTA power measurement. Thus, it is ensured that the same portion of the transmitting lobe and/or the receiving lobe of the device under test is probed in each OTA power measurement, but for up to N different distances.

In an embodiment of the present disclosure, the OTA measurement system further comprises an analysis circuit, wherein the analysis circuit is configured to determine transmitting characteristics of the device under test and/or receiving characteristics of the device under test based on the first OTA power measurement and based on the second OTA power measurement.

In some embodiments, the analysis circuit is configured to determine the transmitting characteristics and/or the receiving characteristics based on the OTA power measurements alone, such that no phase measurements are necessary, which are typically difficult to execute in the near-field region of the device under test.

In order to determine the transmitting characteristics of the device under test, the power of a signal transmitted by the device under test may be measured via the first one of the at least two measurement antennas in the first OTA power measurement, and via the second one of the at least two measurement antennas in the second OTA power measurement, respectively. The power of the signal received from the device under test is then measured by the OTA measurement system, for example by a corresponding power measurement circuit of the OTA measurement system.

The OTA measurement system may be configured to assess the uplink performance of the device under test based on the determined transmitting characteristics, i.e., based on the measured power(s). In some embodiments the analysis circuit is configured to assess the uplink performance of the device under test based on the determined transmitting characteristics, i.e. based on the measured power(s).

In order to determine the receiving characteristics of the device under test, a signal having a predetermined power may be generated and transmitted via the first one of the at least two measurement antennas in the first OTA power measurement, and via the second one of the at least two measurement antennas in the second OTA power measurement, respectively. The respectively generated signal is received by the device under test. The device under test may measure the power(s) of the signal(s) received from the respective measurement antenna. The device under test may generate a power measurement signal comprising information on the measured power(s).

The OTA measurement system may be configured to assess the downlink performance of the device under test based on the power(s) measured by the device under test and/or based on the power measurement signal, for example based on the determined receiving characteristics of the device under test.

In some embodiments, the analysis circuit may be configured to assess the downlink performance of the device under test based on the power(s) measured by the device under test and/or based on the power measurement signal, for example based on the determined receiving characteristics of the device under test.

According to another aspect of the present disclosure, the analysis circuit is configured to extrapolate the determined transmitting characteristics of the device under test and/or the determined receiving characteristics of the device under test to distances from the test location other than the distances of the measurement antennas. Thus, the transmitting characteristics and/or the receiving characteristics of the device under test can be determined even for distances where no actual OTA power measurement is performed, namely by extrapolating the results of the OTA power measurements performed. In some embodiments, the determined transmitting characteristics and/or receiving characteristics may be extrapolated to distances that are larger than the distances at which the OTA power measurements have been performed.

However, it is noted that the determined transmitting characteristics and/or receiving characteristics may also be extrapolated to distances that are smaller than the distances at which the OTA power measurements have been performed.

Moreover, in the context of the present disclosure, the term "extrapolate" is understood to also include the case where the determined transmitting characteristics and/or receiving characteristics are extrapolated to distances lying in between the distances at which the OTA power measurements have been performed, which may also be called "interpolation".

In a further embodiment of the present disclosure, the analysis circuit is configured to extrapolate the determined transmitting characteristics of the device under test and/or the determined receiving characteristics of the device under test to an intermediate-field region and/or to a far-field region. Accordingly, the OTA power measurements may be performed in a near-field region of the device under test, such that the measurement system is particularly compact and the OTA power measurements can be performed with a high dynamic range, as described above. The transmitting characteristics and/or the receiving characteristics of the device under test can then be accurately determined for the intermediate-field region and the far-field region of the device under test by extrapolating the transmitting characteristics and/or receiving characteristics determined in the near-field region.

In some embodiments, the analysis circuit is configured to extrapolate the determined transmitting characteristics of the device under test and/or the determined receiving characteristics of the device under test by fitting an extrapolation function to results of the OTA power measurements. In general, the extrapolation function describes a dependency of the transmitting characteristics and/or of the receiving characteristics of the device under test on a distance from the device under test. By fitting the extrapolation function to the results of the OTA power measurement, parameters of the extrapolation function, such as coefficients of individual functional terms, may be determined. Accordingly, after fitting the extrapolation function to the results of the OTA power measurements, the dependencies of the transmitting characteristics and/or of the receiving characteristics on the distance from the device under test are known.

In some embodiments, the extrapolation function may be fitted to the results of the OTA power measurements by a least squares technique.

The extrapolation function may comprise a power series in the inverse distance from the device under test. Accordingly, the extrapolation function may comprise a series of terms, wherein each term corresponds to a respective coefficient $A'_{nm}$ divided by the distance (from the device under test) to the power of k, wherein n, m, and k are integers that are equal to or greater than zero.

For example, the power series may have the following form: $A'_{00}+A'_{01}/d+A'_{02}/d^2$+further terms.

Thus, fitting the extrapolation function to the results of the OTA power measurements may mean determining the coefficients $A'_{nm}$ of the extrapolation function.

In some embodiments, the coefficients $A'_{nm}$ of the extrapolation function may be determined by a least squares technique.

According to an aspect of the present disclosure, the transmitting characteristics and/or the receiving characteristics comprise a signal gain, a signal power, and/or a signal transmission function. However, it is to be understood that the transmitting characteristics and/or the receiving characteristics may comprise any other parameter that is suitable in order to characterize the performance of the device under test.

In some embodiments, the extrapolation function described above may describe the signal gain, the signal power and/or the signal transmission function in dependence of a distance from the device under test.

According to another aspect of the present disclosure, the OTA measurement system further comprises a compact antenna test range (CATR) and/or a plane wave synthesizer. It is to be understood that the CATR and/or the plane wave synthesizer may be provided in addition to the plurality of measurement antennas described above. The measurements conducted by the plurality of measurement antennas may be supplemented with additional measurement data obtained via measurements by the CATR and/or by the plane wave synthesizer. Thus, the performance of the device under test, for example with respect to the transmitting characteristics and/or the receiving characteristics of the device under test, can be assessed with high precision.

In an embodiment of the present disclosure, the OTA measurement system comprises an anechoic chamber, and wherein the plurality of measurement antennas and the DUT positioner are arranged within the anechoic chamber. In general, the anechoic chamber is configured to reduce unwanted reflections of electromagnetic waves inside the anechoic chamber. For example, an inside of the anechoic chamber may be coated with an absorber material and/or with absorber structures that are configured to absorb electromagnetic waves. Accordingly, the performance of the device under test can be assessed with enhanced precision, as interfering reflections are reduced or even eliminated.

In some embodiments, the anechoic chamber may be configured to shield an interior of the anechoic chamber from electromagnetic waves originating outside of the anechoic chamber. Thus, unwanted perturbations from outside of the OTA measurement systems are reduced or even eliminated.

The CATR and/or the plane wave synthesizer described above may be arranged within the anechoic chamber In a further embodiment of the present disclosure, a relative orientation between the device under test and a boresight of the first one of the at least two measurement antennas for the first OTA power measurement is the same as a relative orientation between the device under test and a boresight of the second one of the at least two measurement antennas for the second OTA power measurement. In other words, the device under test has the same relative orientation to the boresight of the respective active measurement antenna being active during the respective OTA power measurement for each OTA power measurement. Thus, it is ensured that the same portion of the transmitting lobe and/or the receiving lobe of the device under test is probed in each OTA power measurement, but for different distances.

Therein and in the following, the term "boresight of an antenna" relates to the axis of maximum gain of the respective antenna. Thus, in a transmitter mode, the "boresight" relates to the axis of maximum radiated power of the respective antenna. In a receiver mode, the "boresight" relates to the axis of maximum receivable power of the respective antenna, i.e., to the main reception direction.

Embodiments of the present disclosure further provide an over-the-air (OTA) measurement method for performing OTA measurements on a device under test by an OTA measurement system. In an embodiment, the OTA measurement system comprises a plurality of measurement antennas, and a DUT positioner. At least two measurement antennas of the plurality of measurement antennas are arranged at different distances from the test location. The at least two measurement antennas are arranged at different elevation angles and/or at different azimuth angles with respect to the test location. In an embodiment, the OTA measurement method comprises the following steps:

positioning a device under test at a test location by the DUT positioner;

rotating the device under test into a first orientation by the DUT positioner, wherein the first orientation has a first DUT azimuth angle and a first DUT elevation angle with respect to the test location;

performing a first OTA power measurement on the device under test by a first one of the at least two measurement antennas;

rotating the device under test into a second orientation by the DUT positioner, wherein the second orientation has a second DUT azimuth angle and a second DUT elevation angle with respect to the test location; and performing a second OTA power measurement on the device under test by a second one of the at least two measurement antennas.

The first DUT azimuth angle, the first DUT elevation angle, the second DUT azimuth angle, and the second DUT elevation angle are selected such that a relative orientation between the device under test in the first orientation and the first one of the at least two measurement antennas is the same as a relative orientation between the device under test in the second orientation and the second one of the at least two measurement antennas.

In some embodiments, one or more of the OTA measurement systems described above are configured to perform examples of the OTA measurement method.

Regarding the advantages and further properties of the OTA measurement method, reference is made to the explanations given above with respect to the OTA measurement system, which also hold for the OTA measurement method, and vice versa.

According to an aspect of the present disclosure, transmitting characteristics of the device under test and/or receiving characteristics of the device under test are determined based on the first OTA power measurement and based on the second OTA power measurement. In some embodiments, the transmitting characteristics and/or the receiving characteristics are determined based on the OTA power measurements alone, such that no phase measurements are necessary, which are typically difficult to execute in the near-field region of the device under test.

In an embodiment of the present disclosure, the determined transmitting characteristics of the device under test and/or the determined receiving characteristics of the device under test are extrapolated to distances from the test location other than the distances of the measurement antennas. Thus, the transmitting characteristics and/or the receiving characteristics of the device under test can be determined even for distances where no actual OTA power measurement is performed, namely by extrapolating the results of the OTA power measurements performed. In some embodiments, the determined transmitting characteristics and/or receiving characteristics may be extrapolated to distances that are larger than the distances at which the OTA power measurements have been performed.

However, it is noted that the determined transmitting characteristics and/or receiving characteristics may also be extrapolated to distances that are smaller than the distances at which the OTA power measurements have been performed.

Moreover, in the context of the present disclosure, the term "extrapolate" is understood to also include the case where the determined transmitting characteristics and/or receiving characteristics are extrapolated to distances lying in between the distances at which the OTA power measurements have been performed, which may also be called "interpolation".

According to another aspect of the present disclosure, the determined transmitting characteristics of the device under test and/or the determined receiving characteristics of the device under test are extrapolated to an intermediate-field region and/or to a far-field region. Accordingly, the OTA power measurements may be performed in a near-field region of the device under test, such that the measurement system is particularly compact and the OTA power measurements can be performed with a high dynamic range, as described above. The transmitting characteristics and/or the receiving characteristics of the device under test can then be accurately determined for the intermediate-field region and the far-field region of the device under test by extrapolating the transmitting characteristics and/or receiving characteristics determined in the near-field region.

In a further embodiment of the present disclosure, the determined transmitting characteristics of the device under test and/or the determined receiving characteristics of the device under test are extrapolated by fitting an extrapolation function to results of the OTA power measurements. In general, the extrapolation function describes a dependency of the transmitting characteristics and/or of the receiving characteristics of the device under test on a distance from the device under test. By fitting the extrapolation function to the results of the OTA power measurement, parameters of the extrapolation function, such as coefficients of individual functional terms, may be determined. Accordingly, after fitting the extrapolation function to the results of the OTA power measurements, the dependencies of the transmitting characteristics and/or of the receiving characteristics on the distance from the device under test are known.

Further, an over-the-air (OTA) measurement system is provided. In an embodiment, the OTA measurement system comprises at least one measurement antenna, an antenna positioner, a DUT positioner, and a control circuit, such as a controller. The DUT positioner is configured to position a device under test at a test location. The antenna positioner is configured to position the at least one measurement antenna at a plurality of measurement locations, wherein the measurement locations are arranged at different distances from the test location.

The controller is configured to control the DUT positioner to rotate the device under test at the test location in azimuth and/or elevation. The controller further is configured to control the antenna positioner to position the at least one measurement antenna at a predefined distance from the test location. The controller further is configured to control the antenna positioner to rotate the at least one measurement antenna in azimuth and/or elevation. The controller is configured to control the DUT positioner to rotate the device under test into a first orientation for a first OTA power measurement by the at least one measurement antenna at a first measurement location having a first distance from the test location. The controller is configured to control the DUT positioner to rotate the device under test into a second orientation for a second OTA power measurement by the at least one measurement antenna at a second measurement location having a second distance from the test location. The controller is further configured to control the antenna positioner to rotate the at least one measurement antenna such that a relative orientation between the device under test in the first orientation and the at least one measurement antenna at the first measurement location is the same as a relative orientation between the device under test in the second orientation and the at least one measurement antenna at the second measurement location.

In other words, the distance between the at least one measurement antenna and the test location can be adapted by the antenna positioner, such that a device under test can be tested at different distances, as described above with respect to the other embodiments.

For each OTA power measurement, the device under test and/or the at least one measurement antenna are rotated, namely such that the relative orientation with respect to the azimuth angle and the elevation angle between the device under test and the at least one measurement antenna is the same for each OTA power measurement.

For example, the antenna positioner may comprise a telescoping boom or a telescoping mast. Accordingly, the distance of the at least one measurement antenna from the test location may be varied by telescoping the boom or the mast.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

Figure 1:
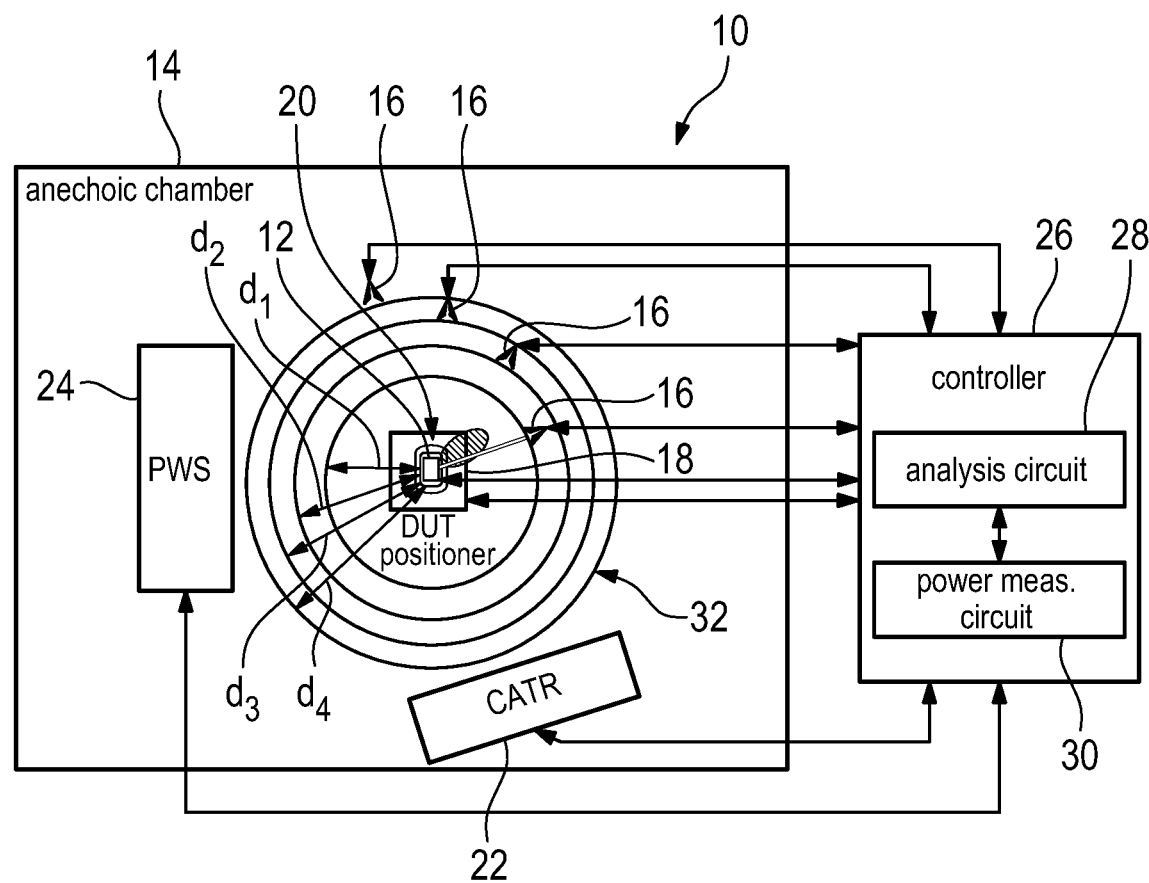
FIG. 1 schematically shows an OTA measurement system according to an embodiment of the present disclosure.

FIG. 1 schematically shows an OTA measurement system 10. In general, the OTA measurement system 10 is configured to perform OTA measurements on a device under test 12 in a predetermined frequency range, for example in a high frequency range such as the frequency range associated with millimeter-waves. For example, the device under test 12 may be a smartphone, a tablet, a communication radio, a WLAN router, a standalone antenna, or any other electronic device that is configured to receive and/or transmit electromagnetic waves with certain frequencies. In some embodiments, the OTA measurement system 10 may be configured to perform 5G conformance tests, for example 3GPP 5G NR FR2 UE conformance tests.

In the embodiment shown, the OTA measurement system 10 comprises an anechoic chamber 14 with a plurality of measurement antennas 16 located inside of the anechoic chamber 14. The OTA measurement system 10 further comprises a DUT positioner 18 that is configured to hold the device under test 12 in a test location 20 inside of the anechoic chamber 14.

In an embodiment, the DUT positioner 18 may be established as a so-called combined-axis positioner, such that the DUT positioner 18 can rotate the device under test 12 in azimuth and/or elevation, i.e., adapt the azimuth angle and/or the elevation angle of the device under test 12 with respect to the test location 20. In that regard, the DUT positioner 18 in some embodiments includes a number of rotational stages.

Optionally, the OTA measurement system 10 further comprises a compact antenna test range (CATR) 22 and/or a plane wave synthesizer (PWS) 24 within the anechoic chamber 14.

The OTA measurement system 10 further comprises a controller 26 that comprises circuitry, including an analysis circuit 28 and a power measurement circuit 30. It is noted that the analysis circuit 28 and/or the power measurement circuit 30 may alternatively be established separately from the controller 26.

The controller 26 is connected with the device under test 12, with the measurement antennas 16, with the DUT positioner 18, with the CATR 22, and with the PWS 24 in a signal-transmitting manner.

Therein and in the following, the term "connected in a signal transmitting manner" is understood to denote a cable-based or wireless connection that is configured to transmit signals between the respective devices or components.

The measurement antennas 16 are arranged in a spherical pattern around the test location 20. More precisely, the measurement antennas 16 are arranged on spherical shells having different distances from the test location 20. Accordingly, the OTA measurement system 10 may be established as a spherical measurement system, which may also be called a "spherical scanning system".

In the embodiment shown in FIG. 1, a first one of the measurement antennas 16 is arranged at a distance $d_1$ from the test location 20. Moreover, the first one of the measurement antennas 16 has a predetermined first azimuth angle and a predetermined first elevation angle with respect to the test location 20.

A second one of the measurement antennas 16 is arranged at a distance $d_2$ from the test location 20. The second one of the measurement antennas 16 has a predetermined second azimuth angle and a predetermined second elevation angle with respect to the test location 20.

A third one of the measurement antennas 16 is arranged at a distance $d_3$ from the test location 20. The third one of the measurement antennas 16 has a predetermined third azimuth angle and a predetermined third elevation angle with respect to the test location 20.

A fourth one of the measurement antennas 16 is arranged at a distance $d_4$ from the test location 20. The fourth one of the measurement antennas 16 has a predetermined fourth azimuth angle and a predetermined fourth elevation angle with respect to the test location 20.

It is noted that the OTA measurement system 10 may comprise more or less than four measurement antennas 16, namely an arbitrary number N of measurement antennas 16. Accordingly, there may be N measurement antennas 16 that are arranged at N different distances from the test location 20. Therein, the azimuth angles and/or the elevation angles of the N measurement antennas 16 are pairwise different, such that there is no pair of measurement antennas 16 having the same angle coordinates with respect to the test location 20.

Without restriction of generality, the case where all of the measurement antennas 16 are located in a measurement region 32 that is associated with a near-field region of the device under test 12 is described hereinafter. However, it is to be understood that one, several, or even all of the measurement antenna 16 may also be arranged in an intermediate-field region and/or in a far-field region of the device under test 12.

Figure 2:
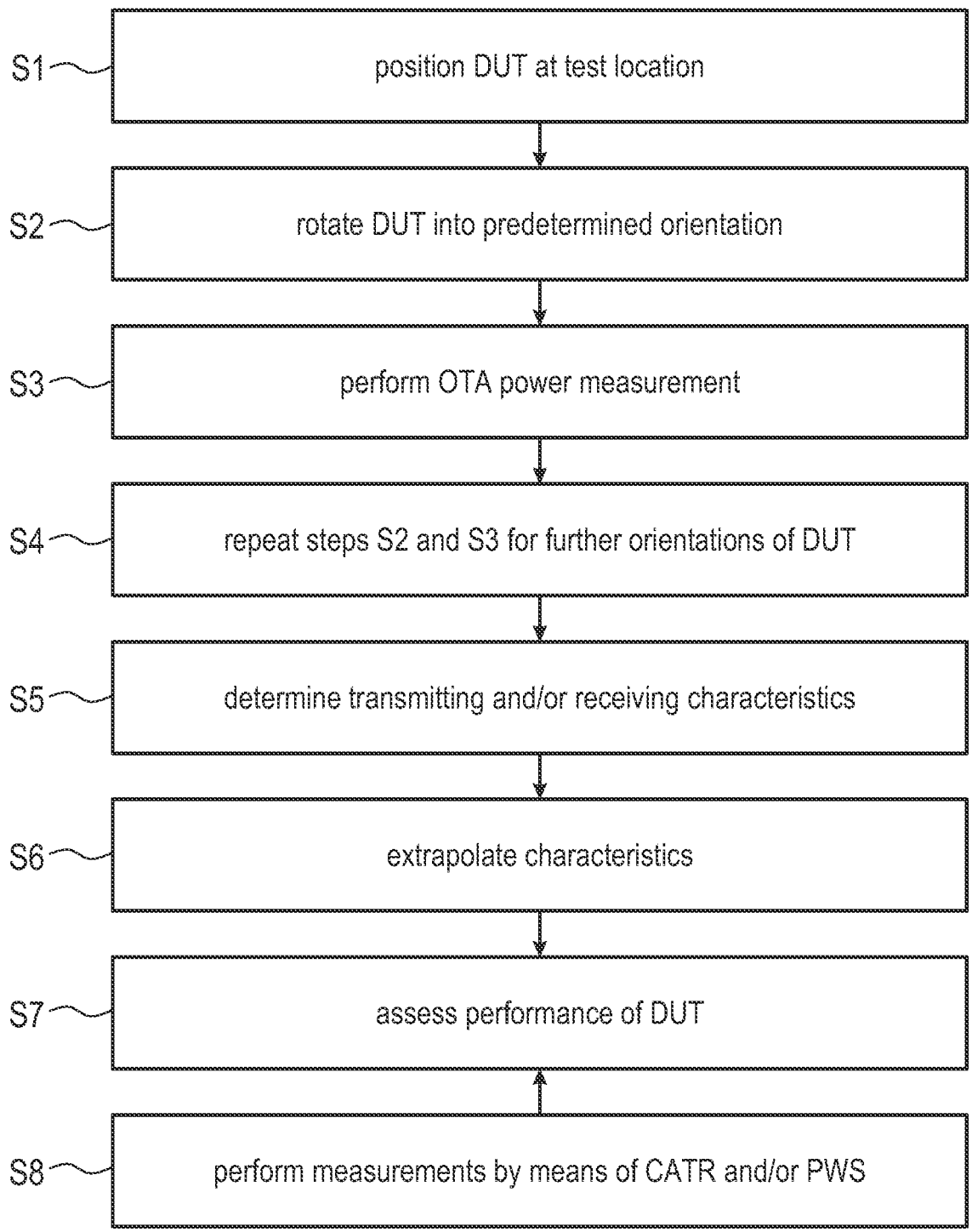
FIG. 2 shows a flow chart of an OTA measurement method according to an embodiment of the present disclosure.

The OTA measurement system 10 is configured to perform an OTA measurement method for performing OTA measurements on the device under test 12. An example of an OTA measurement method is described in the following with reference to FIG. 2.

The device under test 12 is positioned at the test location 20 by the DUT positioner 18 (step S1).

Figure 3:
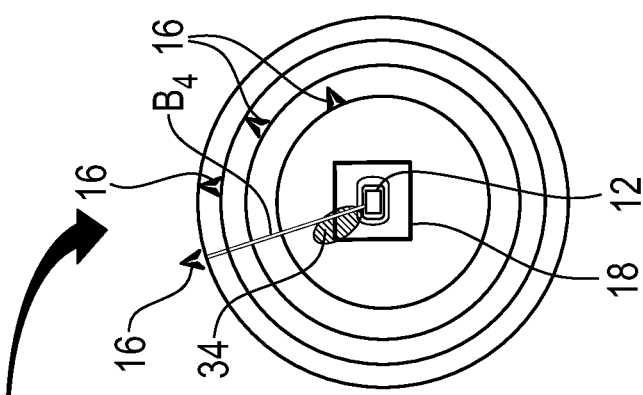
FIGS. 3A to 3D respectively shows a portion of the OTA measurement system of FIG. 1 during different steps of the OTA measurement method.

The control circuitry of the controller 26 controls the DUT positioner 18 to rotate the device under test 12 into a first orientation that is depicted in FIG. 3A (step S2).

The first orientation has a first DUT azimuth angle and a first DUT elevation angle with respect to the test location 20. For example, the first orientation is chosen such that a predefined portion of a transmitting and/or receiving lobe 34 of the device under test 12 faces the first one of the measurement antennas 16, i.e., the measurement antenna 16 having the distance $d_1$ from the test location 20. In other words, the first orientation is chosen such that a predetermined solid angle of the transmitting and/or receiving lobe 34 of the device under test 12 faces the first one of the measurement antennas 16.

Thus, in the first orientation, the device under test 12 has a predetermined relative orientation to the first one of the measurement antennas 16. More precisely, the device under test 12 has a predetermined relative orientation to a boresight $B_1$ of the first one of the measurement antennas 16.

An OTA power measurement is performed in the first orientation of the device under test 12 via the first one of the measurement antennas 16 (step S3).

Therein and in the following, the term "OTA power measurement" is understood to denote an uplink power measurement and/or a downlink power measurement.

In the case of an uplink power measurement, a signal transmitted by the device under test 12 is received by the first one of the measurement antennas 16. The power of the signal received from the device under test 12 is then measured by the OTA measurement system 10, for example by the power measurement circuit 30. The power measured by the power measurement circuit 30 may be forwarded to the analysis circuit 28 for further analysis.

In the case of a downlink power measurement, the controller 26 controls the first one of the measurement antennas 16 to generate or rather transmit a signal, which is then received by the device under test 12.

The device under test 12 may determine a power of the signal received from the first one of the measurement antennas 16. The device under test 12 may further generate a power measurement signal comprising information on the measured power. The power measured by the device under test 12 and/or the corresponding power measurement signal may be forwarded to the analysis circuit 28 for further analysis.

Steps S2 and S3 are repeated for at least one further measurement antenna 16 other than the first one of the measurement antennas, for example for all further measurement antennas 16 (step S4).

Without restriction of generality, it is assumed in the following that steps S2 and S3 are repeated for all further measurement antennas 16.

In general, the device under test 12 is rotated such that the device under test 12 has the same relative orientation to the respectively active measurement antenna 16 for each OTA power measurement.

Thus, in the representative embodiment shown in FIG. 1, a total of four different OTA power measurements are performed via the four measurement antennas 16.

As is illustrated in FIGS. 3B to 3D, the device under test 12 is always rotated such that the same portion of the transmitting and/or receiving lobe 34 is facing the respectively measurement antenna 16 for each OTA power measurement. Accordingly, a relative orientation between the device under test 12 and the respective boresight $B_1$, $B_2$, $B_3$, $B_4$ of the respectively active measurement antenna 16 is the same for all OTA power measurements.

In other words, the same solid angle of the transmitting and/or receiving lobe 34 is probed in each OTA measurement, but at different distances $d_1$ to $d_4$, as the measurement antennas 16 have different distances $d_1$ to $d_4$ from the test location 20 or rather from the device under test 12.

Transmitting characteristics and/or receiving characteristics are determined by the analysis circuit 28 based on the OTA power measurements described above (step S5).

The transmitting characteristics and/or the receiving characteristics comprise a signal gain, a signal power, and/or a signal transmission function. All these possibilities will be collectively denoted by a function C in the following.

In general, the transmitting characteristics and/or receiving characteristics depend on the distance d between the respective measurement antenna 16 and the device under test 12. Thus, four different measurement points $C(d_1)$, $C(d_2)$, $C(d_3)$, and $C(d_4)$ of the transmitting characteristics and/or receiving characteristics are determined in step S5. The determined transmitting characteristics and/or receiving characteristics are extrapolated to distances other than the distances of the measurement antennas 16 (step S6).

In some embodiments, the determined transmitting characteristics and/or receiving characteristics may be extrapolated to distances that are larger than the distances at which the OTA power measurements have been performed. However, it is noted that the determined transmitting characteristics and/or receiving characteristics may also be extrapolated to distances that are smaller than the distances at which the OTA power measurements have been performed.

In the context of the present disclosure, the term "extrapolate" is understood to also include the case where the determined transmitting characteristics and/or receiving characteristics are extrapolated to distances lying in between the distances at which the OTA power measurements have been performed, which may also be called "interpolation".

The extrapolation may be performed by fitting an extrapolation function $f(d)$ to the results $C(d_1)$, $C(d_2)$, $C(d_3)$, and $C(d_4)$ of the OTA power measurements.

In general, the extrapolation function $f(d)$ describes a dependency of the transmitting characteristics and/or of the receiving characteristics of the device under test 12 on the distance d from the device under test 12.

The extrapolation function $f(d)$ may have the following form:

$$f(d) = \left| \frac{b'_0(d)}{a_0} \right|^2,$$

with $$\left| \frac{b_0'(d)}{a_0} \right|^2 = \frac{|\exp(ikd)|^2}{|1 - \Gamma_n \Gamma_l|^2 d^2} \left( A_{00}' + \frac{A_{01'}}{d} + \frac{A_{02'}}{d^2} + \ldots \right).$$

Thus, the extrapolation function $f(d)$ comprises a power series in the inverse distance d from the device under test 12.

In other words, the extrapolation function comprises a factor having a series of terms, wherein each term corresponds to a respective coefficient $A'_{nm}$ divided by the distance d (from the device under test 12) to the power of k, wherein n, m, and k are integers that are equal to or greater than zero.

By fitting the extrapolation function $f(d)$ to the results $C(d_1)$, $C(d_2)$, $C(d_3)$, and $C(d_4)$ of the OTA power measurements, the coefficients $A'_{nm}$ of the extrapolation function $f(d)$ are determined, for example by a least squares technique.

After fitting the extrapolation function $f(d)$ to the results of the OTA power measurements, the dependencies of the transmitting characteristics and/or of the receiving characteristics on the distance d from the device under test 12 are known for arbitrary distances d, i.e., also for the far-field region and/or the intermediate-field region.

The method described above has the advantage that no phase measurements are necessary, as the extrapolation function $f(d)$ only depends on the absolute value of the phase squared, i.e. on $|\exp(ikd)|^2$.

Thus, the OTA power measurements are sufficient for extrapolating the transmitting characteristics and/or the receiving characteristics to the intermediate-field region and/or to the far-field region.

A performance of the device under test 12 is assessed based on the extrapolated transmitting characteristics and/or the extrapolated receiving characteristics (step S7).

In some embodiments, the performance of the device under test 12 in the intermediate-field region and/or the far-field region may be assessed based on the transmitting characteristics and/or the receiving characteristics extrapolated from the measurement points $C(d_1)$, $C(d_2)$, $C(d_3)$, and $C(d_4)$ obtained in the near-field region of the device under test 12.

Optionally, further OTA measurements may be conducted by the CATR 22 and/or the PWS 24 (step S8).

Therein, the CATR 22 and/or the PWS 24 may be arranged at a different angle relative to the test location 20 than the measurement antennas 16, for example perpendicular to at least one of the measurement antennas 16.

In general, the CATR 22 generates far-field conditions at a particular test location by enhancing the distance traveled by the signals. This is usually achieved by incorporating a reflector into the measurement setup, such that the signals have to travel between the device under test 12 and a corresponding CATR measurement antenna via the reflector.

The PWS 24 may comprise a phased array, i.e., an array of phase-controlled antennas, which are configured to simulate far-field conditions within the near-field of the phased array. Thus, far-field measurements on the device under test 12 can be performed in an actual near-field region of the device under test 12.

The measurements conducted by the plurality of measurement antennas 16 described above with respect to steps S1 to S6 may be supplemented with the additional measurement data obtained via the measurements by the CATR 22 and/or by the PWS 24 described with respect to step S8.

Thus, the performance of the device under test 12, for example with respect to the transmitting characteristics and/or the receiving characteristics of the device under test 12, can be assessed based on an enhanced measurement data set.

Figure 4:
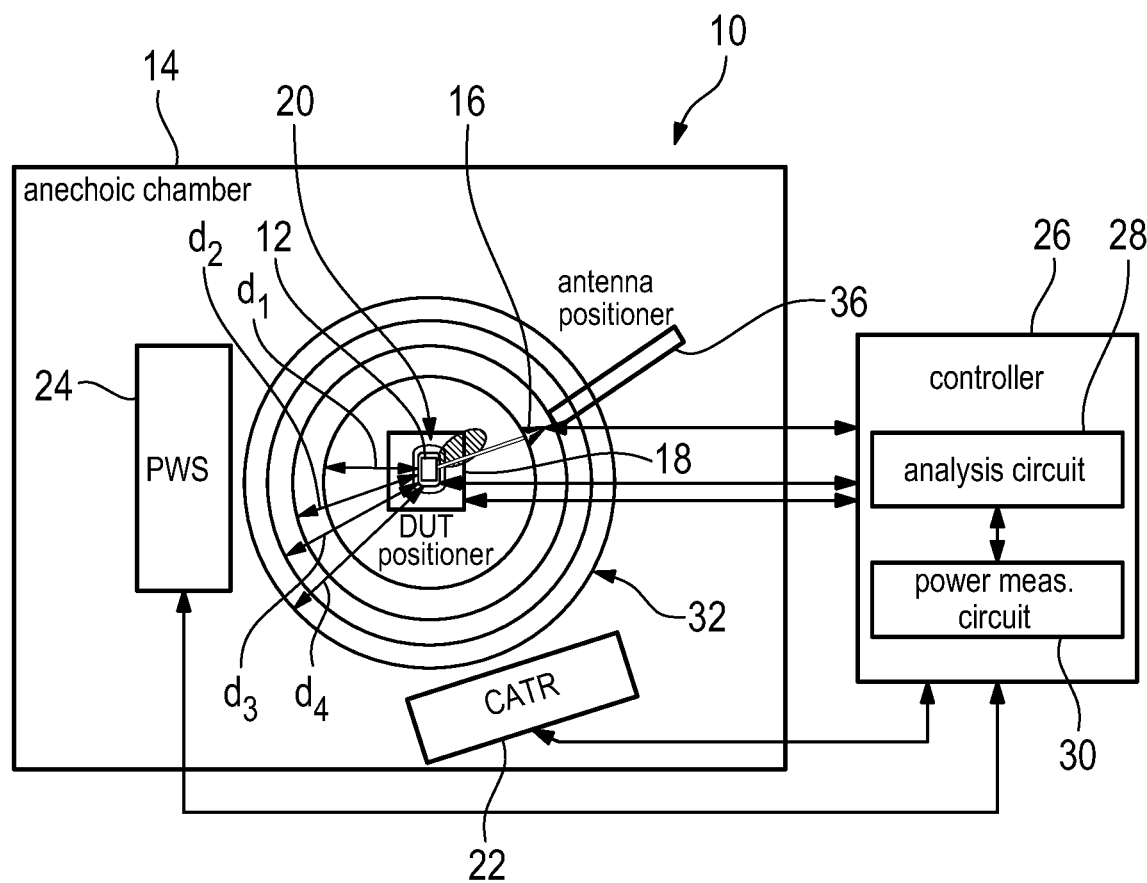
FIG. 4 schematically shows an OTA measurement system according to another embodiment.

FIG. 4 shows a further embodiment of the OTA measurement system 10, wherein only the differences compared to the embodiments described above are explained in the following. In the embodiment shown in FIG. 4, the measurement system 10 comprises at least one measurement antenna 16. In some embodiments, the measurement system 10 comprises only a single measurement antenna 16.

The measurement system 10 further comprises an antenna positioner 36 that is located within the anechoic chamber 14. In general, the antenna positioner 36 is configured to position the at least one measurement antenna 16, for example the single measurement antenna 16, at a plurality of measurement locations, wherein the measurement locations are arranged at different distances $d_1$, $d_2$, $d_3$, $d_4$ from the test location 20. Put differently, only one single measurement antenna 16 may be used that is positioned by the antenna positioner 36 accordingly.

For example, the antenna positioner 36 may comprise a telescoping boom or a telescoping mast. Accordingly, the distance of the measurement antenna 16 from the test location 20 may be varied by telescoping the boom or the mast. In some embodiment, the antenna positioner 36 is alternatively or additionally configured to rotate the at least one measurement antenna 36 in azimuth and/or elevation. In that regard, the antenna positioner 36 includes one or more rotational stages.

In some embodiments, the rotational movement of the antenna positioner 36 and the one of the DUT positioner 18 are synchronized with each other.

The OTA power measurement described above can be performed analogously with the measurement system 10 shown in FIG. 4.

Between each OTA power measurement, the device under test 12 is repositioned to another measurement location having a different distance from the test location 20. Moreover, the device under test 12 and/or the at least one measurement antenna 16 are rotated such that the relative orientation with respect to the azimuth angle and the elevation angle between the device under test 12 and the at least one measurement antenna 16 is the same for each OTA power measurement.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An over-the-air (OTA) measurement system, the OTA measurement system comprising a plurality of measurement antennas, a DUT positioner, and a control circuitry,
   wherein the DUT positioner is configured to position a device under test at a test location,
   wherein at least two measurement antennas of the plurality of measurement antennas are arranged at different distances from the test location,
   wherein the at least two measurement antennas are arranged at different elevation angles and/or at different azimuth angles with respect to the test location,
   wherein the control circuitry is configured to:
      control the DUT positioner to rotate the device under test at the test location in azimuth and/or elevation;
      control the DUT positioner to rotate the device under test into a first orientation for a first OTA power measurement by a first one of the at least two measurement antennas; and
      control the DUT positioner to rotate the device under test into a second orientation for a second OTA power measurement by a second one of the at least two measurement antennas; and
   wherein a relative orientation between the device under test in the first orientation and the first one of the at least two measurement antennas is the same as a relative orientation between the device under test in the second orientation and the second one of the at least two measurement antennas.

2. The OTA measurement system of claim 1, wherein the plurality of measurement antennas is arranged in a measurement region, wherein the measurement region is associated with a near-field of the device under test.

3. The OTA measurement system of claim 1, wherein the plurality of measurement antennas comprises N measurement antennas, wherein N is an integer greater than two.

4. The OTA measurement system of claim 3, wherein the distances of the N measurement antennas from the test location and/or the elevation angles and/or the azimuth angles of the N measurement antennas with respect to the test location are pairwise different.

5. The OTA measurement system of claim 3, wherein the control circuitry is configured to control the DUT positioner to rotate the device under test into N different orientations, wherein each orientation is associated with an OTA power measurement.

6. The OTA measurement system of claim 5, wherein a relative orientation between the device under test and the respective measurement antenna used for the respective OTA power measurement is the same for the N different orientations.

7. The OTA measurement system of claim 1, wherein the OTA measurement system further comprises an analysis circuit, wherein the analysis circuit is configured to determine transmitting characteristics of the device under test and/or receiving characteristics of the device under test based on the first OTA power measurement and based on the second OTA power measurement.

8. The OTA measurement system of claim 7, wherein the analysis circuit is configured to extrapolate the determined transmitting characteristics of the device under test and/or the determined receiving characteristics of the device under test to distances from the test location other than the distances of the measurement antennas.

9. The OTA measurement system of claim 8, wherein the analysis circuit is configured to extrapolate the determined transmitting characteristics of the device under test and/or the determined receiving characteristics of the device under test to an intermediate-field region and/or to a far-field region.

10. The OTA measurement system of claim 8, wherein the analysis circuit is configured to extrapolate the determined transmitting characteristics of the device under test and/or the determined receiving characteristics of the device under test by fitting an extrapolation function to results of the OTA power measurements.

11. The OTA measurement system of claim 10, wherein the extrapolation function comprises a power series in the inverse distance from the device under test.

12. The OTA measurement system of claim 7, wherein the transmitting characteristics and/or the receiving characteristics comprise a signal gain, a signal power, and/or a signal transmission function.

13. The OTA measurement system of claim 1, wherein the OTA measurement system further comprises a compact antenna test range and/or a plane wave synthesizer.

14. The OTA measurement system of claim 1, wherein the OTA measurement system comprises an anechoic chamber, and wherein the plurality of measurement antennas and the DUT positioner are arranged within the anechoic chamber.

15. The OTA measurement system of claim 1, wherein a relative orientation between the device under test and a boresight of the first one of the at least two measurement antennas for the first OTA power measurement is the same as a relative orientation between the device under test and a boresight of the second one of the at least two measurement antennas for the second OTA power measurement.

16. An over-the-air (OTA) measurement method for performing OTA measurements on a device under test by an OTA measurement system, the OTA measurement system comprising a plurality of measurement antennas, and a DUT positioner, wherein at least two measurement antennas of the plurality of measurement antennas are arranged at different distances from the test location, and wherein the at least two measurement antennas are arranged at different elevation angles and/or at different azimuth angles with respect to the test location, the OTA measurement method comprising:
positioning a device under test at a test location by the DUT positioner;
rotating the device under test into a first orientation by the DUT positioner, wherein the first orientation has a first DUT azimuth angle and a first DUT elevation angle with respect to the test location;
performing a first OTA power measurement on the device under test by a first one of the at least two measurement antennas;
rotating the device under test into a second orientation by the DUT positioner, wherein the second orientation has a second DUT azimuth angle and a second DUT elevation angle with respect to the test location; and
performing a second OTA power measurement on the device under test by a second one of the at least two measurement antennas,
wherein the first DUT azimuth angle, the first DUT elevation angle, the second DUT azimuth angle, and the second DUT elevation angle are selected such that a relative orientation between the device under test in the first orientation and the first one of the at least two measurement antennas is the same as a relative orientation between the device under test in the second orientation and the second one of the at least two measurement antennas.

17. The OTA measurement method of claim 16, wherein transmitting characteristics of the device under test and/or receiving characteristics of the device under test are determined based on the first OTA power measurement and based on the second OTA power measurement.

18. The OTA measurement method of claim 17, wherein the determined transmitting characteristics of the device under test and/or the determined receiving characteristics of the device under test are extrapolated to distances from the test location other than the distances of the measurement antennas.

19. The OTA measurement method of claim 18, wherein the determined transmitting characteristics of the device under test and/or the determined receiving characteristics of the device under test are extrapolated to an intermediate-field region and/or to a far-field region.

20. The OTA measurement method of claim 18, wherein the determined transmitting characteristics of the device under test and/or the determined receiving characteristics of the device under test are extrapolated by fitting an extrapolation function to results of the OTA power measurements.

* * * * *